US012573527B2

(12) United States Patent
Yoshida

(10) Patent No.: US 12,573,527 B2
(45) Date of Patent: Mar. 10, 2026

(54) OXIDE SUPERCONDUCTING WIRE

(71) Applicant: Fujikura Ltd., Tokyo (JP)

(72) Inventor: Tomo Yoshida, Sakura (JP)

(73) Assignee: Fujikura Ltd., Tokyo (JP)

( * ) Notice: Subject to any disclaimer, the term of this patent is extended or adjusted under 35 U.S.C. 154(b) by 293 days.

(21) Appl. No.: 18/246,333

(22) PCT Filed: Aug. 19, 2021

(86) PCT No.: PCT/JP2021/030470
§ 371 (c)(1),
(2) Date: Mar. 23, 2023

(87) PCT Pub. No.: WO2022/064912
PCT Pub. Date: Mar. 31, 2022

(65) Prior Publication Data
US 2023/0395285 A1     Dec. 7, 2023

(30) Foreign Application Priority Data

Sep. 25, 2020     (JP) .................................. 2020-160613

(51) Int. Cl.
H01B 12/06          (2006.01)
H10N 60/85          (2023.01)
(52) U.S. Cl.
CPC ........... H01B 12/06 (2013.01); H10N 60/855 (2023.02)
(58) Field of Classification Search
CPC .............................. H01B 12/06; H10N 60/855
See application file for complete search history.

(56) References Cited

U.S. PATENT DOCUMENTS

| | | | |
|---|---|---|---|
| 6,673,387 B1 | 1/2004 | Zhang et al. | |
| 2021/0323834 A1* | 10/2021 | Hirata | ................ H10N 60/0828 |

FOREIGN PATENT DOCUMENTS

| | | |
|---|---|---|
| CN | 102598159 A | 7/2012 |
| CN | 102676993 A | 9/2012 |
| CN | 103026426 A | 4/2013 |
| CN | 103189934 A | 7/2013 |
| CN | 106961829 A | 7/2017 |
| CN | 108140457 A | 6/2018 |

(Continued)

OTHER PUBLICATIONS

Machine translation of WO2020137490 (Year: 2020).*

(Continued)

*Primary Examiner* — Jeremy C Norris
(74) *Attorney, Agent, or Firm* — Osha Bergman Watanabe & Burton LLP

(57)          ABSTRACT

An oxide superconducting wire includes: a substrate having a main surface; a superconducting layer disposed above the substrate and formed of a rare-earth high-temperature super-conductor; and a protective layer disposed on the supercon-ducting layer and in contact with the superconducting layer. An a-axis direction is oriented perpendicular to the main surface of the substrate. The superconducting layer includes a-axis oriented grains oriented along the a-axis direction. An a-axis oriented grain ratio is defined as a proportion of the a-axis oriented grains to an entirety of crystal grains forming the superconducting layer. The a-axis oriented grain ratio is greater than or equal to 4.1% and less than or equal to 11.9%.

2 Claims, 2 Drawing Sheets

(56) References Cited

FOREIGN PATENT DOCUMENTS

| JP | 2012-204189 | A | 10/2012 |
| JP | 2012204190 | A | 10/2012 |
| JP | 2014-110125 | A | 6/2014 |
| WO | 2020/137490 | A1 | 7/2020 |

OTHER PUBLICATIONS

English Translation of International Search Report issued in corresponding International Application No. PCT/JP2021/030470 mailed Oct. 26, 2021 (2 pages).

* cited by examiner

OXIDE SUPERCONDUCTING WIRE

TECHNICAL FIELD

The present invention relates to an oxide superconducting wire.

This application claims priority from Japanese Patent Application No. 2020-160613, filed Sep. 25, 2020, the contents of which are incorporated herein by reference in their entirety.

BACKGROUND

Patent Document 1 discloses an oxide superconducting wire having a laminated structure that includes an intermediate layer, a superconducting layer, and a protective layer successively laminated on a substrate.

Conventionally, to produce a superconducting wire having a length of several kilometers, a plurality of short superconducting wires are connected together by soldering.

Patent Literature 1

Japanese Unexamined Patent Application, First Publication, No. 2014-110125

However, when oxide superconducting wires are solder-connected, connection resistance at the connection part increases, and joule heat is generated at the connection part. Specifically, the connection resistance due to solder connecting is predominant in an interlayer resistance between a superconducting layer and a protective layer, and it is important to reduce the interlayer resistance in order to reduce the joule heat. Furthermore, when connection resistance increases, a bypass current is less likely to flow from the superconducting layer to the protective layer when bypassing the current during quenching.

SUMMARY

One or more embodiments of the invention provide an oxide superconducting wire with a reduced interlayer resistance between a superconducting layer and a protective layer.

An oxide superconducting wire according to one or more embodiments of the invention includes a substrate having a main surface, a superconducting layer provided above the substrate and formed of a rare-earth high-temperature superconductor, and a protective layer provided on the superconducting layer and in contact with the superconducting layer. The superconducting layer includes a-axis oriented grains having an a-axis oriented in a direction perpendicular to the main surface of the substrate. An a-axis oriented grain ratio expressing a proportion of the a-axis oriented grains to the entirety of crystal grains forming the superconducting layer is in a range of 4.1 to 11.9%.

Here, the term "a superconducting layer provided above the substrate" does not only means that a superconducting layer is provided on the substrate but also means that a superconducting layer base body is provided above the substrate in a configuration in which an intermediate layer film or the like is disposed between the superconducting layer and the substrate.

Conventionally, in a crystal configuration of an oriented superconducting layer having crystals oriented in an a-axis, a b-axis, and a c-axis, it is known that the c-axis of crystal grains is often oriented in a direction perpendicular to the main surface of the substrate. In contrast, the inventors have discovered that, of the crystal grains forming a superconducting layer, a-axis oriented grains having the a-axis oriented in a direction perpendicular to the main surface of the substrate have an effect on an interlayer resistance between the superconducting layer and the protective layer. Furthermore, as a result of intensive research, the inventors have discovered that it is possible to achieve a reduction in the interlayer resistance between the superconducting layer and the protective layer by forming the superconducting layer such that a proportion of a-axis oriented grains to the entirety of the crystal grains of the superconducting layer is 4.1 to 11.9%, and hence arriving at one or more embodiments of the invention.

According to one or more embodiments of the invention, it is possible to produce an oxide superconducting wire having a reduced interlayer resistance between the superconducting layer and the protective layer. By preparing a plurality of the oxide superconducting wires and solder-connecting the oxide superconducting wires adjacent to each other, it is possible to produce a long superconducting wire having a reduced connection resistance.

In the oxide superconducting wire according to one or more embodiments of the invention, the a-axis oriented grain ratio may be less than or equal to 8.2%.

With this configuration, it is possible to not only reduce an interlayer resistance but also to ensure a critical current density in a longitudinal direction of the oxide superconducting wire.

An oxide superconducting wire according to one or more embodiments of the invention includes a substrate having a main surface, a first superconducting layer provided above the substrate and formed of a rare-earth high-temperature superconductor, a second superconducting layer provided above the first superconducting layer and formed of a rare-earth high-temperature superconductor, and a protective layer provided on the second superconducting layer and in contact with the second superconducting layer. The second superconducting layer includes a-axis oriented grains having an a-axis oriented in a direction perpendicular to the main surface of the substrate. An a-axis oriented grain ratio expressing a proportion of the a-axis oriented grains to the entirety of crystal grains forming the second superconducting layer is in a range of 4.1 to 11.9%.

According to one or more embodiments of the invention, it is possible to produce an oxide superconducting wire having a reduced interlayer resistance between the second superconducting layer and the protective layer. By preparing a plurality of the oxide superconducting wires and solder-connecting the oxide superconducting wires adjacent to each other, it is possible to produce a long superconducting wire having a reduced connection resistance.

In the oxide superconducting wire according to one or more embodiments of the invention, the first superconducting layer includes first a-axis oriented grains serving as a-axis oriented grains having an a-axis oriented in a direction perpendicular to the main surface of the substrate. The second superconducting layer includes second a-axis oriented grains serving as a-axis oriented grains having an a-axis oriented in a direction perpendicular to the main surface of the substrate. An a-axis oriented grain ratio expressing a proportion of the first a-axis oriented grains to the entirety of crystal grains forming the first superconducting layer is defined as a first ratio, and an a-axis oriented grain ratio expressing a proportion of the second a-axis oriented grains to the entirety of crystal grains forming the second superconducting layer is defined as a second ratio. In this case, the first ratio is lower than the second ratio.

With this configuration, it is possible to reduce an inter-layer resistance between the superconducting layer and the protective layer by the second superconducting layer, and it is possible to not only reduce an interlayer resistance but also to ensure a critical current density in a longitudinal direction of the oxide superconducting wire by the first superconducting layer. In other words, by providing the oxide superconducting wire including two superconducting layers having a-axis oriented grain ratios different from each other, it is possible to obtain both effects of reducing an interlayer resistance and ensuring a critical current density in the longitudinal direction of the oxide superconducting wire.

According to one or more embodiments of the invention, it is possible to reduce an interlayer resistance between a superconducting layer and a protective layer.

DETAILED DESCRIPTION

Figure 1:
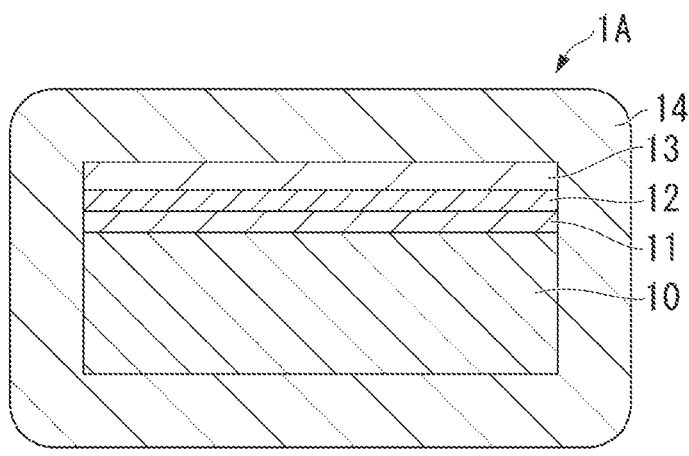
FIG. 1 is an enlarged cross-sectional view showing an oxide superconducting wire according to one or more embodiments of the invention.

Hereinafter, an oxide superconducting wire according to embodiments of the invention will be described in detail with reference to the drawings. In the drawings used in the description, the relevant portions of the invention may be enlarged, for convenience, in order to make the features thereof easier to understand, and the dimension ratios and the like for each of the components are not necessarily the same as those in reality.

First, an oxide superconducting wire according to one or more embodiments will be described with reference to FIG. 1.

The oxide superconducting wire 1A according to one or more embodiments includes a substrate 10, an intermediate layer 11 provided on the substrate 10, a superconducting layer 12 provided on the intermediate layer 11, a protective layer 13 provided on the superconducting layer 12, and a stabilizing layer 14 provided on the protective layer 13. The oxide superconducting wire 1A may include an insulating coating layer that covers the substrate 10, the intermediate layer 11, the superconducting layer 12, the protective layer 13, and the stabilizing layer 14.

A height of the oxide superconducting wire 1A, in other words, a length from a bottom surface of the substrate 10 to the upper surface of the protective layer 13 (the length in the up-down direction in FIG. 1) is, for example, 80 µm.

A width of the oxide superconducting wire 1A, in other words, a length from a left end to a right end of the oxide superconducting wire 1A (the length in the left-right direction in FIG. 1) is, for example, 12 mm.

(Substrate 10)

The substrate 10 is a tape-shaped metal substrate. As specific examples of metals forming the metal substrate, a nickel alloy typified by hastelloy (registered trademark), stainless steel, an oriented Ni—W alloy having a texture introduced into the nickel alloy, or the like.

(Intermediate Layer 11)

The intermediate layer 11 may have a multi-layered structure, and for example, may have a diffusion-preventing layer, a bed layer, an orientation layer, a cap layer, or the like in order from the substrate 10 to the superconducting layer 12. In a configuration having the above-described layers provided in the intermediate layer 11, the number of each layer is not limited to one. A layer of the above-described layers forming the intermediate layer 11 may be omitted. Furthermore, a configuration including two or more layers having the same type repeatedly stacked may be adopted. The intermediate layer 11 may be metal oxide. By forming the superconducting layer 12 on the intermediate layer 11 having excellent orientation, it is possible to easily obtain the superconducting layer 12 having excellent orientation.

(Superconducting Layer 12)

The superconducting layer 12 has a function of allowing a current to flow thereto when being in a superconducting state.

The superconducting layer 12 is formed of a rare-earth high-temperature superconductor and is provided so as to be in contact with the protective layer 13.

Specifically, as a material used for the superconducting layer 12, an oxide superconductor having generally-known compositions can be widely used, and a Y-based supercon-ductor, a copper oxide superconductor such as a Bi-based superconductor, or the like is adopted.

As a composition of the Y-based superconductor, for example, such as $REBa_2Cu_3O_{7-x}$ ("RE" refers to rare earth elements such as Y, La, Nd, Sm, Er, Gd, or the like, and "x" refers to oxygen defect is adopted.

As a specific composition of the Y-based superconductor, Y123 ($YBa_2Cu_3O_{7-x}$) and Gd123 ($GdBa_2Cu_3O_{7-x}$) are adopted.

As a composition of the Bi-based superconductor, for example, $Bi_2Sr_2Ca_{n-1}Cu_nO_{4+2n+\delta}$ ("n" refers to the number of layers of $CuO_2$, and "δ" refers to the excess oxygen) is adopted. Although the oxide superconductor has an insulator serving as a mother material, the oxide superconductor has oriented crystal structures and possesses properties showing superconducting characteristics by causing oxygen to be incorporated into the oxide superconductor by oxygen annealing treatment.

Moreover, the superconducting layer 12 includes a-axis oriented grains serving as crystalline grains having an a-axis oriented in a direction perpendicular to the main surface of the substrate 10. In the a-axis oriented grains, a Cu—O surface on which a current is likely to flow thereon in a superconducting state is present so as to be perpendicular to the main surface of the substrate. The superconducting layer 12 including the a-axis oriented grains has an excellent quantum binding property at a crystal grain boundary between the a-axis oriented grains, and the superconducting characteristics are not almost degraded at the crystal grain boundary. Consequently, in the superconducting layer 12, electricity is likely to flow in the a-axis direction. A propor-tion (a-axis oriented grain ratio Xa) of the a-axis oriented grains included in superconducting layer 12 to the entirety (100%) of the crystalline grains forming the superconduct-ing layer 12 is in a range of 4.1 to 11.9%. Furthermore, in one or more embodiments, the a-axis oriented grain ratio Xa be less than or equal to 8.2% in the range.

By adjusting conditions such as a film deposition tem-perature, a film formation rate (film-formation speed), or the like when forming the superconducting layer 12, it is possible to control the a-axis oriented grain ratio Xa to be a desired value in the aforementioned range.

(Protective Layer 13)

The protective layer 13 is a current path that functions as a bypass route through which an overcurrent flows due to some accidents when a current is being applied to the oxide superconducting wire 1A. In one or more embodiments, the protective layer 13 may be formed of Ag or a material containing at least Ag. Furthermore, a material used to form the protective layer 13 may be a composite or an alloy containing noble metal such as Au, Pt, or the like, and or a plurality of the materials mentioned above may be used therefor.

(Stabilizing Layer 14)

As a material used for the stabilizing layer 14, copper, a Cu—Zn alloy (brass), a copper alloy such as a Cu—Ni alloy, aluminum, an aluminum alloy, stainless steel, or the like is selected.

The stabilizing layer 14 may be configured of a plurality of layers. Moreover, the stabilizing layer 14 may be formed by metallic plating. The stabilizing layer 14 may have a configuration in which the entirety of a multi-layered body including the substrate the protective layer 13, and a layer located between the substrate 10 and the protective layer 13 is coated with a plating layer.

Next, actions and effects of the oxide superconducting wire 1A having the above-described configuration will be described.

The superconducting layer 12 in contact with the protective layer 13 includes the a-axis oriented grains having the a-axis oriented in the direction perpendicular to the main surface of the substrate, and includes the a-axis oriented grains. Accordingly, the Cu—O surface serving as a superconducting current path is present so as to be perpendicular to the main surface of the substrate 10. Since the a-axis is oriented in the direction perpendicular to the main surface of the substrate 10, a low-value resistance is obtained in the direction perpendicular to the main surface of the substrate, and a current is likely to flow therein. Particularly, since the a-axis oriented grain ratio Xa is set in a range of 4.1 to 11.9% as described hereinbelow, the effect of reducing an interlayer resistance between the superconducting layer 12 and the protective layer 13 is obtained. Furthermore, by setting the a-axis oriented grain ratio Xa to be less than or equal to 8.2%, it is possible to not only reduce an interlayer resistance but also to suppress a reduction in a critical current density in a longitudinal direction of the oxide superconducting wire 1A. Note that, in the explanation described below, the critical current density of the longitudinal direction of the oxide superconducting wire is simply referred to as the critical current density.

On the other hand, in conventional oxide superconducting wires, in general, a superconducting layer is formed such that a Cu—O surface is present in a direction parallel to a main surface of a substrate. In this situation, since a c-axis of a crystalline grain is oriented in a direction perpendicular to the main surface of the substrate, a current is less likely to flow in a direction perpendicular to the main surface of the substrate.

In contrast, according to one or more embodiments, the proportion (a-axis oriented grain ratio Xa) of the a-axis oriented grains having the a-axis oriented in the direction perpendicular to the main surface of the substrate 10 is optimized, therefore, an amount of a current path the mutually flows between the superconducting layer 12 and the protective layer 13 increases, and it is possible to reduce the interlayer resistance.

Next, an oxide superconducting wire according to one or more embodiments will be described with reference to FIG. 2.

The oxide superconducting wire 1B according to one or more embodiments is different from the oxide superconducting wire 1A according to the above-mentioned embodiments in that a superconducting layer is configured of two layers (a first superconducting layer and a second superconducting layer).

Figure 2:
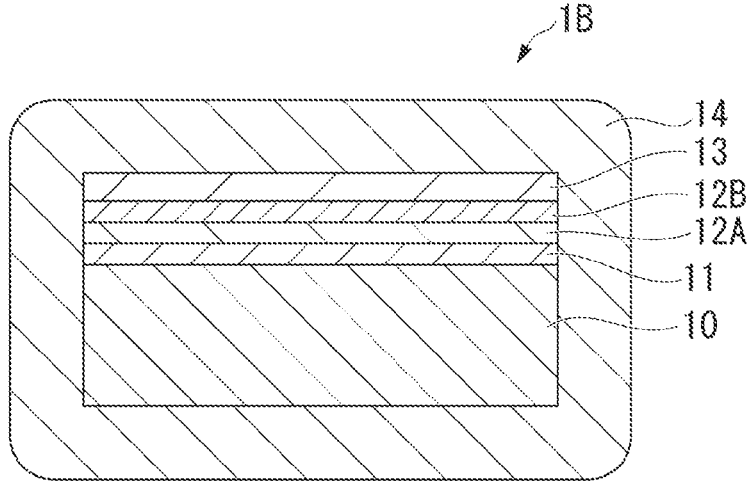
FIG. 2 is an enlarged cross-sectional view showing an oxide superconducting wire according to one or more embodiments of the invention.

In FIG. 2, identical reference numerals are used for the elements which are identical to those of the above-mentioned embodiments, and the explanations thereof are omitted or simplified here.

The oxide superconducting wire 1B according to one or more embodiments includes the substrate 10, the intermediate layer 11 provided on the substrate 10, a first superconducting layer 12A provided on the intermediate layer 11, a second superconducting layer 12B provided on the first superconducting layer 12A, the protective layer 13 provided on the second superconducting layer 12B, and the stabilizing layer 14 provided on the protective layer 13. The oxide superconducting wire 1B include an insulating coating layer that covers the substrate 10, the intermediate layer 11, the first superconducting layer 12A, the second superconducting layer 12B, the protective layer 13, and the stabilizing layer 14.

Each of the first superconducting layer 12A and the second superconducting layer 12B is formed of a rare-earth high-temperature superconductor. The first superconducting layer 12A is formed on the intermediate layer 11 but is not in contact with the protective layer 13. The second superconducting layer 12B is formed on the first superconducting layer 12A and is in contact with the protective layer 13.

A proportion (a-axis oriented grain ratio Xa2 of the second superconducting layer 12B, second ratio) of the a-axis oriented grains (second a-axis oriented grains) of the second superconducting layer 12B to the entirety of crystal grains forming the second superconducting layer 12B is in a range of 4.1 to 11.9% similar to the superconducting layer 12 according to the above-mentioned embodiments.

On the other hand, A proportion (a-axis oriented grain ratio Xa1 of the first superconducting layer 12A, first ratio) of the a-axis oriented grains (first a-axis oriented grains) of the first superconducting layer 12A to the entirety of crystal grains forming the first superconducting layer 12A is less than the a-axis oriented grain ratio Xa2 of the second superconducting layer 12B.

For example, in one or more embodiments, when the a-axis oriented grain ratio Xa2 of the second superconducting layer 12B is 4.1%, the a-axis oriented grain ratio Xa1 of the first superconducting layer 12A may be less than 4.1%.

Additionally, when the a-axis oriented grain ratio Xa2 of the second superconducting layer 12B is 11.9%, the a-axis oriented grain ratio Xa1 of the first superconducting layer 12A is only necessary to be less than 11.9%. However, in one or more embodiments, since it is possible to obtain a high critical current density by setting the a-axis oriented grain ratio Xa to be less than or equal to 8.2%, the a-axis oriented grain ratio Xa1 of the first superconducting layer 12A may be less than or equal to 8.2% in this case.

Next, actions and effects of the oxide superconducting wire 1B having the above-described configuration will be described.

Since the second superconducting layer 12B in contact with the protective layer 13 includes the a-axis oriented grains having the a-axis oriented in the direction perpendicular to the main surface of the substrate and includes the a-axis oriented grains, the Cu—O surface serving as a superconducting current path is present so as to be perpendicular to the main surface of the substrate. Since the a-axis is oriented in the direction perpendicular to the main surface of the substrate 10, a low-value resistance is obtained in the direction perpendicular to the main surface of the substrate, and a current is likely to flow therein. Since the a-axis oriented grain ratio Xa2 of the second superconducting layer 12B is set in a range of 4.1 to 11.9% as described hereinbelow, the effect of reducing an interlayer resistance between the second superconducting layer 12B and the protective layer 13 is obtained. Moreover, since the value of the a-axis oriented grain ratio Xa1 of the first superconducting layer 12A is lower than the value of the a-axis oriented grain ratio Xa2 of the second superconducting layer 12B, a proportion of grains having the a-axis or the b-axis oriented in a longitudinal direction of the oxide superconducting wire 1B is ensured. Consequently, it is possible to obtain a high critical current density in the oxide superconducting wire 1B. Specifically, it is possible to obtain a high critical current density by setting a value of the a-axis oriented grain ratio Xa1 of the first superconducting layer 12A to be less than or equal to 8.2%.

Accordingly, it is possible to reduce an interlayer resistance depending on increase in amount of a current path the mutually flows between the second superconducting layer 12B and the protective layer 13, and it is possible to ensure the critical current density of the first superconducting layer 12A. That is, since the oxide superconducting wire 1B includes two superconducting layers having the respective a-axis oriented grain ratios Xa1 and Xa2 different from each other, it is possible to obtain both effects of reducing an interlayer resistance and ensuring a critical current density.

In one or more embodiments, the number of layers forming the superconducting layer is two. As long as the a-axis oriented grain ratio Xa of the superconducting layer in contact with the protective layer is in a range of 4.1 to 11.9%, a superconducting layer may be configured of three or more layers.

(Connected Structure)

Next, a connected structure formed by using the oxide superconducting wire according to the above-mentioned embodiments of the invention will be described with reference to FIG. 3.

The connected structure formed by using the oxide superconducting wire according to the above-mentioned embodiments of the invention includes a structure in which a plurality of the oxide superconducting wires 1A according to the above-mentioned embodiments are solder-connected together. Particularly, FIG. 3 shows a connection portion at which two oxide superconducting wires are solder-connected together.

Figure 3:
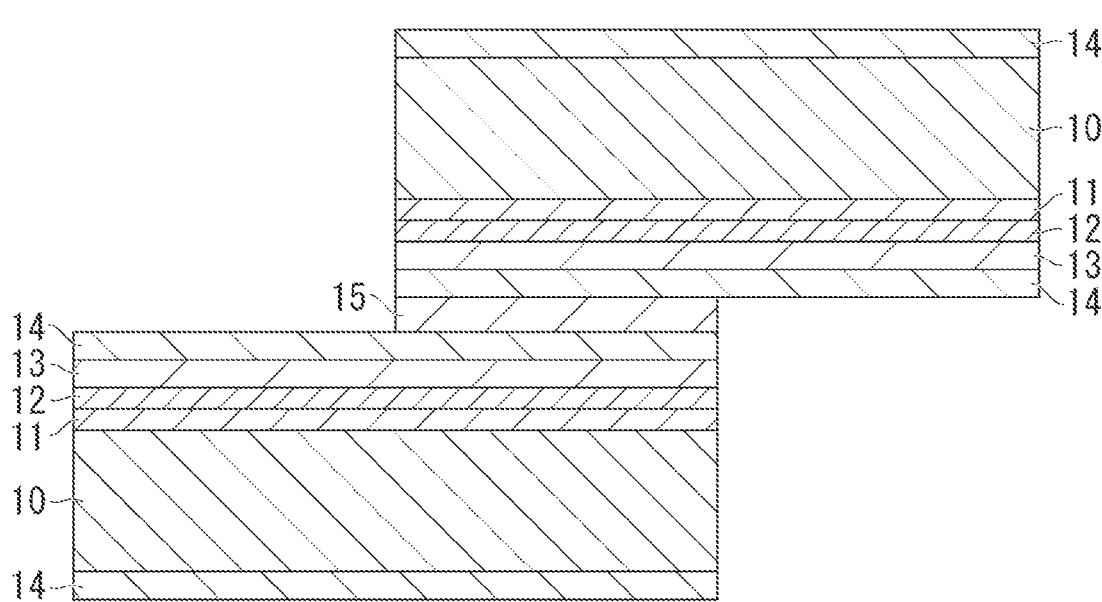
FIG. 3 is a view showing a connected structure formed using an oxide superconducting wire according to one or more embodiments of the invention and is an enlarged cross-sectional view showing a connected structure having solder-connected two wires of a plurality of oxide super-conducting wires.

As shown in FIG. 3, a surface of the stabilizing layer 14 coating the protective layer 13 of one oxide superconducting wire (the oxide superconducting wire located at an upper side in FIG. 3) faces a surface of the stabilizing layer 14 coating the protective layer 13 of the other oxide superconducting wire (the oxide superconducting wire located at a lower side in FIG. 3). The "one the oxide superconducting wire" may be referred to as a first oxide superconducting wire. The "the other oxide superconducting wire" may be referred to as a second oxide superconducting wire. The "one the oxide superconducting wire" and the "the other oxide superconducting wire" may be referred to as an "oxide superconducting wires overlapped to each other." Additionally, "oxide superconducting wires overlapped to each other" means that the oxide superconducting wires overlap each other in a thickness direction of the oxide superconducting wire.

In this state, the stabilizing layer 14 located at an end portion of one oxide superconducting wire is electrically connected to the stabilizing layer 14 located at an end portion of the other of oxide superconducting wire via solder 15.

Note that, although not shown in FIG. 3, the end portion of each of the two oxide superconducting wires is connected to a different oxide superconducting wire via solder. Also in the connected structure, an electrical connected structure using the solder 15 shown in FIG. 3 is adopted. That is, a long oxide superconducting wire having a plurality of oxide superconducting wires that are solder-connected together in the extending direction of the oxide superconducting wire is obtained.

With this configuration, it is possible to produce the long oxide superconducting wire having a reduced connection resistance.

Note that, a plurality of the oxide superconducting wires 1B according to one or more embodiments may be prepared instead of the plurality of the oxide superconducting wires 1A according to the above-mentioned embodiments, and the oxide superconducting wires 1B overlapping each other may be solder-connected together as shown in FIG. 3. Also in this case, it is possible to produce a long superconducting wire having a reduced connection resistance and ensuring the critical current density.

While various embodiments of the invention have been described and shown above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

In the above-described embodiments, the structure including the intermediate layer 11 disposed between the substrate 10 and the superconducting layer 12 and the structure including the intermediate layer 11 disposed between the substrate 10 and the first superconducting layer 12A were described.

In one or more embodiments of the invention, a superconducting layer is only necessary to be provided above a substrate, the superconducting layer may be provided on the substrate, or the superconducting layer may be directly in contact with the substrate.

Working Examples

Next, the invention will be specifically described with reference to Working Examples.

Table 1 shows the evaluation results of a critical current density ratio, an interlayer resistance ratio (R ratio), and an interlayer resistance R ratio regarding Experimental Examples 1 to 9 having a-axis oriented grain ratios Xa (%, a proportion of the a-axis oriented grains to the entirety of crystal grains forming a superconducting layer) different from each other.

TABLE 1

| EXPERIMENTAL EXAMPLE | A-AXIS ORIENTED GRAIN RATIO | CRITICAL CURRENT DENSITY RATIO [Jc RATIO] | INTERLAYER RESISTANCE RATIO [R RATIO] | EVALUATION RESULT OF INTERLAYER RESISTANCE R RATIO |
|---|---|---|---|---|
| 1 | 2.9 | 1 | 1 | FAIL |
| 2 | 3.3 | 0.97 | 0.78 | FAIL |
| 3 | 4.1 | 0.95 | 0.70 | GOOD |
| 4 | 5.4 | 0.92 | 0.68 | GOOD |
| 5 | 6.8 | 0.91 | 0.48 | EXCELLENCE |
| 6 | 8.2 | 0.85 | 0.43 | EXCELLENCE |
| 7 | 11.9 | 0.78 | 0.53 | GOOD |
| 8 | 27.1 | 0.11 | 0.74 | FAIL |
| 9 | 41.7 | 0 | ∞ | FAIL |

A measurement method and a calculation method of the a-axis oriented grain ratio Xa, the critical current density ratio, and the interlayer resistance ratio (R ratio), and the evaluation standards the interlayer resistance R ratio are as follows.

(A-Axis Oriented Grain Ratio Xa)

Measurement of the a-axis oriented grain ratio Xa was carried out with respect to a sample (as depo) before being subjected to oxygen annealing.

The a-axis oriented grain ratio Xa was measured by a $\theta$-$2\theta$ method of XRD. When a count value at the (006) peak is defined as x and a count value at the (200) peak is defined as y, the a-axis oriented grain ratio Xa was calculated by relational expression "(a-axis oriented grain ratio Xa (%))= $(100 \times y)/(x+y)$".

(Critical Current Density Ratio (Jc Ratio))

Regarding measurement and calculation of the critical current density Jc (77K, in self magnetic field), first, a sample after being subjected to oxygen annealing was prepared, and measurement values were obtained by a four-terminal method. The measurement values were divided by a thickness of a superconducting layer, and therefore the critical current densities Jc were obtained.

In Table 1, "critical current density ratio (Jc ratio)" represents a ratio with respect to the critical current density Jc of Experimental Example 1, that is, a proportion in the case in which the critical current density Jc of Experimental Example 1 is 1.

(Interlayer Resistance Ratio (R Ratio))

An interlayer resistance R was measured in a state of a bridging connection in which the top surface and the back surface the wire are not replaced with each other. A connection length was 2 cm. In the bridging connection, measurement was carried out by applying Sn—Pb eutectic solder between bonding faces of two wires, overlapping the bonding faces each other, and pressing a heater against the portion at which the bonding faces overlaps each other.

In Table 1, "Interlayer Resistance Ratio (R Ratio)" represents a ratio with respect to the interlayer resistance of Experimental Example 1, that is, a proportion in the case in which the interlayer resistance of Experimental Example 1 is 1.

(Evaluation of Interlayer Resistance R Ratio)

In Table 1, the result "GOOD" means that the interlayer resistance R ratio was less than or equal to 0.7 and the evaluation result was good. The result "EXCELLENCE" means that the interlayer resistance R ratio was less than or equal to 0.5 and the evaluation result was excellent. In contrast, the result "FAIL" means that the interlayer resistance R ratio exceeds 0.7 and the evaluation result was bad.

From the experimental result shown in Table 1, the following points were apparent.

[1] In the case in which the a-axis oriented grain ratio Xa is in a range of 4.1 to 11.9%, the evaluation result of the interlayer resistance R ratio was good or excellent. Consequently, it was apparent that the interlayer resistance was reduced by setting the a-axis oriented grain ratio Xa of the superconducting layer to be in this range.

[2] In contrast, in the case in which the a-axis oriented grain ratio Xa was less than 4.1% (3.3%, 2.9%) and in the case in which the a-axis oriented grain ratio Xa exceeds 11.9% (27.1%, 41.7%), the interlayer resistance ratio increases, and therefore the evaluation result of the interlayer resistance R ratio was bad. In this condition, it was apparent that a reduction in the interlayer resistance is not achieved.

Note that, although a current path in a vertical direction (a direction perpendicular to the main surface of the substrate) is obtained due to an increase in the a-axis oriented grain ratio Xa, the interlayer resistance ratio increases in the case in which the a-axis oriented grain ratio Xa exceeds 11.9%; it is conceivable that the reason for this is because the crystalline orientation of the superconducting layer becomes uneven due to overabundance of the a-axis oriented grains, other grains blocking a current are generated, the Cu—O surfaces thereof do not align, and a resistance increases.

[3] In the case in which the a-axis oriented grain ratio Xa is in a range of 4.1 to 11.9%, when the a-axis oriented grain ratio Xa was less than or equal to 8.2%, the critical current density ratio was greater than or equal to 0.85. For this reason, it was apparent that both effects of reducing an interlayer resistance and ensuring a critical current density are obtained.

[4] In the case in which the a-axis oriented grain ratio Xa was less than or equal to 4.1%, the critical current density ratio was greater than or equal to 0.95. For this reason, in the configuration including the first superconducting layer not in contact with the protective layer and the second superconducting layer in contact with the protective layer, it was apparent the both effects of reducing an interlayer resistance and ensuring a critical current density are obtained by setting the a-axis oriented grain ratio Xa2 of the second superconducting layer to be in a range of 4.1 to 11.9% and setting the a-axis oriented grain ratio Xa1 of the first superconducting layer to be less than or equal to 4.1%.

Note that, in the configuration including the first superconducting layer and the second superconducting layer, although it is conceivable that the a-axis oriented grain ratio Xa2 of the second superconducting layer is set to be in a range of 4.1 to 11.9% and the a-axis oriented grain ratio Xa1 of the first superconducting layer is set to be less than or equal to 11.9%, it was apparent that the a-axis oriented grain ratio Xa1 of the first superconducting layer may be less than or equal to 8.2% in order to obtain a high degree of the critical current density.

DESCRIPTION OF REFERENCE NUMERALS 1A, 1B . . . oxide superconducting wire, 10 . . . substrate, 11 . . . intermediate layer, 12 . . . superconducting layer, 12A . . . first superconducting layer (superconducting layer), 12B . . . second superconducting layer (superconducting layer), 13 . . . protective layer, 14 . . . stabilizing layer, 15 . . . solder

The invention claimed is:

1. An oxide superconducting wire comprising:

a substrate having a main surface;

a first superconducting layer provided above the substrate and formed of a rare-earth high-temperature superconductor;

a second superconducting layer provided above the first superconducting layer and formed of a rare-earth high-temperature superconductor; and a protective layer provided on the second superconducting layer and in contact with the second superconducting layer; wherein the first superconducting layer includes first a-axis oriented grains serving as a-axis oriented grains having an a-axis oriented in a direction perpendicular to the main surface of the substrate, the second superconducting layer includes a-axis oriented grains having an a-axis oriented in a direction perpendicular to the main surface of the substrate;

the second superconducting layer includes second a-axis oriented grains serving as a-axis oriented grains having an a-axis oriented in a direction perpendicular to the main surface of the substrate, an a-axis oriented grain ratio expressing a proportion of the a-axis oriented grains to an entirety of crystal grains forming the second superconducting layer is in a range of 4.1 to 11.9%, and when an a-axis oriented grain ratio expressing a proportion of the first a-axis oriented grains to an entirety of crystal grains forming the first superconducting layer is defined as a first ratio and an a-axis oriented grain ratio expressing a proportion of the second a-axis oriented grains to an entirety of crystal grains forming the second superconducting layer is defined as a second ratio, the first ratio is lower than the second ratio.

2. The oxide superconducting wire according to claim 1, wherein the a-axis oriented grain ratio is less than or equal to 8.2%.

* * * * *